(12) United States Patent
Kwong et al.

(10) Patent No.: US 6,753,679 B1
(45) Date of Patent: Jun. 22, 2004

(54) TEST POINT MONITOR USING EMBEDDED PASSIVE RESISTANCE

(75) Inventors: Herman Kwong, Kanata (CA);
Richard R. Goulette, Arnprior (CA);
Larry Marcanti, Allen, TX (US)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 10/326,064

(22) Filed: Dec. 23, 2002

(51) Int. Cl.[7] .............................................. G01R 27/32
(52) U.S. Cl. ..................... 324/158.1; 324/639
(58) Field of Search .............................. 324/158.1, 639, 324/637, 329, 314, 690, 724; 174/254, 250; 428/209, 901

(56) References Cited

U.S. PATENT DOCUMENTS 6,417,459 B1 * 7/2002 Kanzaki et al. ............. 174/254
6,501,211 B1 * 12/2002 Nasrollahzadeh ........... 310/338

* cited by examiner

Primary Examiner—Kamand Cuneo
Assistant Examiner—Trung Q. Nguyen
(74) Attorney, Agent, or Firm—Hunton & Williams LLP (57) ABSTRACT

Exemplary techniques for providing a test point in a printed circuit board (PCB) or other circuit device that minimizes or eliminates intrusive effects in the transmitted as well as the monitored data signal are disclosed. A deposited resistor is used to provide a connection between a signal electrode and a transmission line of the PCB. Where the transmission line is embedded, the PCB may also include a tap to connect the signal layer of the PCB (having the embedded transmission line) with the signal electrode at the surface layer of the PCB. The deposited resistor is intended to act as a voltage-divider resistor and to buffer any perturbations of the system resulting from the tap and the introduction of a probe. Additionally, the deposited resistor may be positioned relative to the transmission line as to provide a equalization capacitance to compensate for parasitic capacitance.

20 Claims, 9 Drawing Sheets

TEST POINT MONITOR USING EMBEDDED PASSIVE RESISTANCE

FIELD OF THE INVENTION

The present invention relates generally to monitoring data signals in printed circuit boards (PCBs) and, more particularly, to a technique for using a test point having a deposited resistor to buffer undesirable signal effects resulting from the test point and a probe connected thereto.

BACKGROUND OF THE INVENTION

The capability to test circuits during the development phase often proves advantageous. Further, real-time testing during operation of the circuit often provides circuit designers and manufacturers sought-after feedback for verifying and improving circuit design. To this end, printed circuit boards (PCBs) and other circuit devices often are configured to include test points (also referred to as probe taps) for access to transmission lines in the circuit.

While providing the ability to monitor a transmission line signal, conventional test points often negatively affect the operation of the signal propagated along the transmission line. In most instances, conventional test points are implemented using a tap to provide a connection from the PCB surface to the embedded transmission line. The tap may include, for example, a surface pad for a microstrip transmission line or a via pad, a microvia or a through-hole via for an embedded stripline transmission line. The tap typically introduces a capacitance, referred to herein as Cvia, directly connected to the transmission line. This capacitance, in concert with the impedance of the probe and measurement device, functions as a low-pass filter thereby causing severe attenuation in the signal path. This signal loading is especially detrimental in high-speed digital signals. Even though the capacitance Cvia introduced by conventional taps often may be as low as 200 femtoFarads (fF), this relatively low capacitance, when combined with a data signal rate greater than 3 gigabits/second (Gb/s), typically results in unacceptable signal attenuation. This problem becomes even more pronounced as high-speed digital signaling increases into the tens-of-gigabits range.

Further, such conventional taps using vias typically require clearance holes or antipads in the surface layer over the transmission line tracks. In the event that the via is located near the track, the antipad typically creates a small slot in the ground plane, which can cause perturbations in the data signal, such as voltage reflections due to the impedance discontinuity. On the other hand, if the via is relocated away from the track to minimize this effect, a transmission line stub may be created that further exacerbates the loading effect of the connected via.

A number of techniques have been developed in an attempt to minimize or eliminate signal attenuation during signal monitoring. One common technique includes using a surface mount (SMT) resistor between the circuit and the probe to minimize signal attenuation on the monitored digital signal path. The use of a SMT resistor or other discrete resistor poses a number of problems including: added impedance resulting from the solder joint used on the SMT resistor; a reduction in surface space; and untimely modifications to the circuit layout that may delay the release date of the circuit as well as affect its performance. SMT resistors also have significant inductance, which increases the high frequency attenuation in the monitored signal path.

Alternatively, the testing of the data signal may be deferred downstream at a point where the high-speed signal is demultiplexed to a lower frequency. This approach complicates troubleshooting in the event that errors are detected downstream as it may be difficult to pinpoint exactly where in the path the errors occur.

In view of the foregoing, it would be desirable to provide a technique for monitoring a transmission signal in a circuit that overcomes the above-described inadequacies and shortcomings. More particularly, it would be desirable to provide a technique for signal monitoring in circuits in an efficient and cost effective manner.

SUMMARY OF THE INVENTION

According to the present invention, a technique for monitoring data signals in circuits is provided. In one particular exemplary embodiment, the technique may be realized as a printed circuit board (PCB) comprising a transmission line deposited at a signal layer of the PCB for transmitting a data signal and a signal electrode for providing an electrical connection between the PCB and a probe of a signal monitor. The PCB further comprises a resistor deposited at the signal layer and being in electrical communication with the transmission line and the signal electrode, wherein the resistor is adapted to transmit an impeded signal from the transmission line to the signal electrode, the impeded signal being representative of the data signal. The PCB further may further comprise a microvia in electrical communication with the deposited resistor at the signal layer and the signal electrode and being adapted to transmit the impeded signal from the deposited resistor to the signal electrode. The PCB may also comprise a non-conductive gap between a substantial portion of the resistor and the transmission line, the gap providing an equalization capacitance between the transmission line and the signal electrode.

In another particular embodiment, the technique may be realized as a method for monitoring a data signal transmitted over a transmission line at a signal layer of a printed circuit board (PCB). The method comprises the steps of transmitting an electrical signal representative of the data signal from the transmission line to a signal electrode through a resistor deposited at the signal layer to generate an impeded signal. The method further comprises transmitting the impeded signal from the signal electrode to a signal monitor via a probe attached to the signal electrode. The step of transmitting the electrical signal may include transmitting the electrical signal through a deposited resistor having a non-conductive gap between a substantial portion of the deposited resistor and the transmission line to generate an equalization capacitance between the transmission line and the signal electrode.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

The following description is intended to convey a thorough understanding of the present invention by providing a number of specific embodiments and details involving signal testing and monitoring in printed circuit boards and other circuit devices. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1–15 illustrate various exemplary techniques for providing a test point in a printed circuit board (PCB) or other circuit device that minimizes or eliminates intrusive effects in the transmitted as well as the monitored-data signal. These undesirable effects may include, for example, parasitic capacitance, signal loading, voltage reflections, and the like, that result from the introduction of a test probe. In at least one embodiment, a deposited resistor is used to provide a connection between a signal electrode and a transmission line of the PCB. Where the transmission line is embedded, the PCB may also include a tap to connect the signal layer of the PCB (having the embedded transmission line) with the signal electrode at the surface layer of the PCB. The tap preferably includes a via and more preferably includes a microvia.

The deposited resistor is intended to act as a voltage-divider resistor and to buffer any perturbations of the system resulting from the tap and the introduction of a probe. Additionally, the deposited resistor may be positioned relative to the transmission line as to provide a compensation capacitance to compensate for parasitic capacitance caused by PCB pads, a coaxial socket or other connection apparatus for connecting a probe to the PCB. Although various embodiments of the present invention are described herein in the context of a single-ended signal transmission, various implementations of the present invention may be beneficially utilized in differential-pair or multi-conductor signal applications without departing from the spirit or the scope of the present invention.

Figure 1:
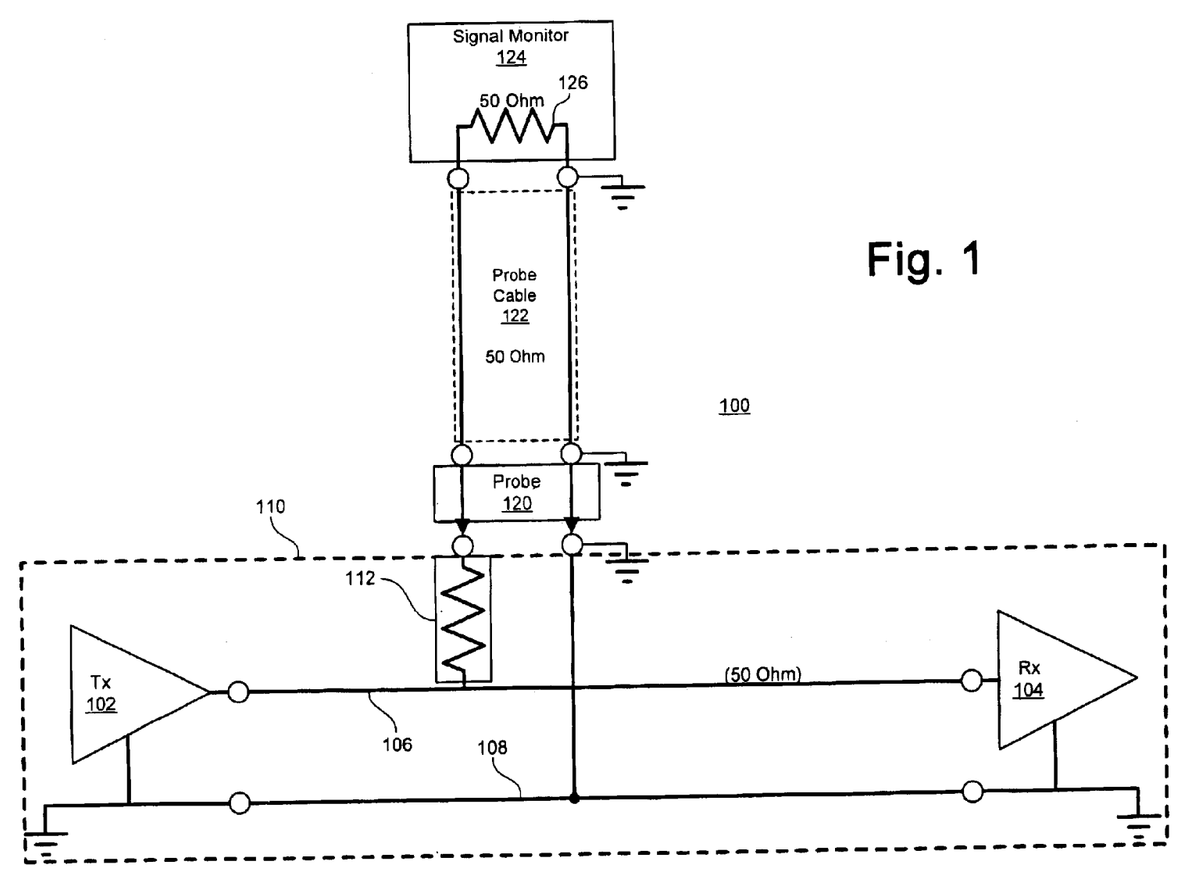
FIG. 1 is a schematic diagram illustrating an exemplary circuit test point having a deposited voltage-divider resistor in accordance with at least one embodiment of the present invention.

Referring now to FIG. 1, an exemplary system 100 for monitoring a data signal in a PCB 110 is illustrated in accordance with at least one embodiment of the present invention. The PCB 110 includes a signal transmitter 102 connected to a signal receiver 104 via a signal transmission line 106 and a ground plane 108. The transmitter 102 preferably includes a high-speed digital transmitter and the receiver 104 preferably includes a high-speed digital receiver operating at a speed of preferably at least 1 Gb/s, more preferably at least 3 Gb/s and most preferably at least 10 Gb/s. In other embodiments, the transceiver 102 and receiver 104 are adapted for low-speed digital transmission, analog signal transmission, and the like. The transmission line 106 may include any of a variety of transmission lines known to those skilled in the art, such as a stripline, an asymmetric stripline, a microstrip, or an embedded microstrip.

In the illustrated embodiment, the PCB 110 further comprises a deposited passive resistor 112 electrically connected to the transmission line 106. In instances wherein the transmission line 106 is embedded below the surface layer (not shown) of the PCB 110, the PCB 110 may further include a tap to the surface layer of the PCB 110. The tap may comprise, for example, a via, or more preferably, a microvia.

The system 100 further may comprise a signal monitor 124, such as a digital logic analyzer, oscilloscope, or other probe, whereby the signal monitor 124 is adapted to monitor, via the deposited resistor 112, a data signal transmitted over the transmission line 106. Accordingly, the signal monitor 124 includes a probe 120 adapted to electrically connect to the ground plane 108 and the deposited resistor 112. A probe cable 122, such as a coaxial cable or twisted-pair wire, is utilized to connect the probe 120 to the signal monitor 124.

In at least one embodiment, the deposited resistor 112 acts as a permanent buffer for minimizing negative perturbations introduced by the probe 120, the probe cable 122 and signal monitor 124 while in use. In instances where the probe 120 is disconnected, the deposited resistor and connecting microvia/signal electrode may present a relatively minor test point loading effect due to the presence of an open-circuit transmission line stub and signal electrode (not shown). However, the impedance of the deposited resistor operates to minimize these effects. The resistor 112 includes, for example, a resistance of preferably about 1Ω to about 1 kΩ, more preferably about 100Ω to about 950Ω, and most preferably about 450 Ω or about 950Ω.

It will be appreciated that the deposited resistor 112 operates as a voltage-divider resistor during an operation of the signal monitor 124. Accordingly, the resistive value of the deposited resistor 112 may be configured to result in the desired voltage division ratio. To achieve a conventional nominal voltage division ratio of 10:1 the impedance of the deposited resistor 112 generally is configured to be nine times the impedance load of the probe 120/signal monitor 124/transmission line 122. Likewise, to achieve a conventional nominal voltage division ratio of, for example, 20:1 the impedance of the deposited resistor 112 typically is configured to be nineteen times the impedance load of the probe 120/signal monitor 124/probe cable 122. In typical implementations, the probe 120/signal monitor 124/transmission cable 122 present a 50Ω impedance load, resulting in the selection of a 450Ω deposited resistor 112 for a nominal 10:1 voltage division ratio and a 950Ω deposited resistor 112 for a nominal 20:1 voltage division ratio.

It may be desirable to select a resistive value that achieves a desirable balance between the benefits of voltage-division and buffering and the detriments of space utilization, power consumption and heat generation. To illustrate, the resistance of the deposited resistor 112 preferably is high enough that the probe 120 does not load down the primary data path (transmission line 106) or cause significant data reflections on the primary data path, but not so high that the monitored signal is attenuated to the point where it is too weak for observation by conventional oscilloscopes. A 450Ω resistor and a 50Ω probe give a 500Ω loading and a 10:1 attenuation which, in many instances, provide a reasonable compromise between negative signal effects and monitored signal attenuation.

It will be appreciated that current techniques for deposing resistive material often result in deposited resistors having undesirable tolerances. To illustrate, deposited resistors made using polymer thick film technology or metal thin film technology often have tolerances greater than ±10%. Accordingly, in at least one embodiment, one or more trimming techniques may be used to adjust the deposited resistive material to fall within the desired tolerance. For example, laser trimming often can be used to achieve resistance tolerances of ±1% for the deposited resistor 212.

Figure 2A:
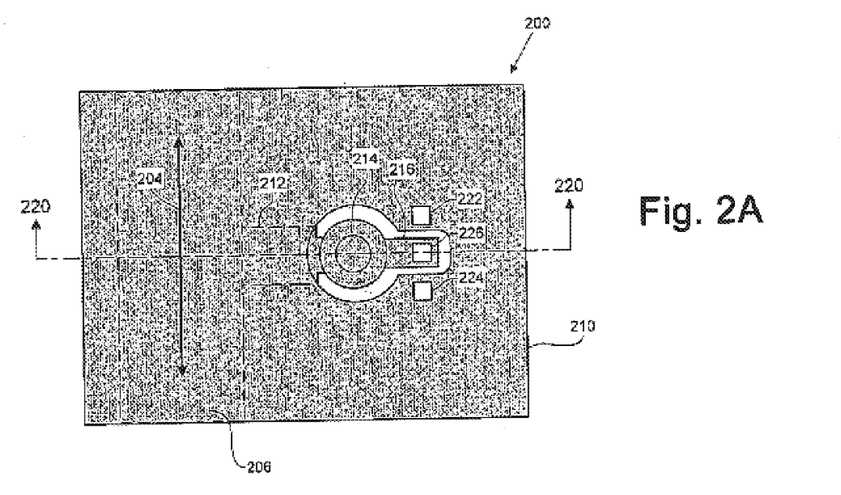
FIG. 2A is a plan view illustrating an exemplary printed circuit board (PCB) having a stripline transmission line and a circuit test point comprising a disposed voltage-divider resistor and microvia in accordance with at least one embodiment of the present invention.
Figure 2B:
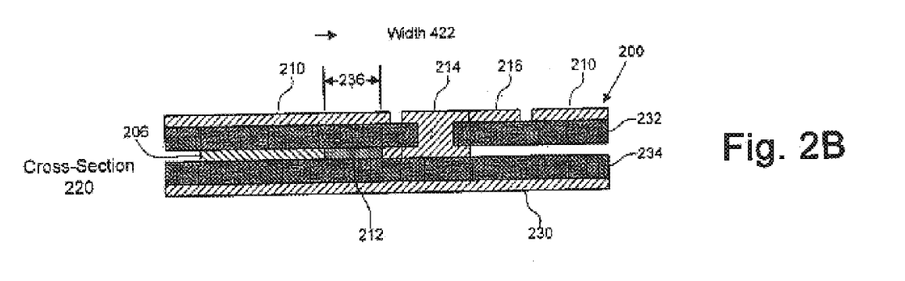
FIG. 2B is a side view illustrating a cross-section of the exemplary PCB of FIG. 2A in accordance with at least one embodiment of the present invention.

Referring now to FIGS. 2A and 2B, an exemplary PCB 200 implementing an exemplary test point for monitoring a data signal transmitted via a stripline transmission line is illustrated in accordance with at least one embodiment of the present invention. FIG. 2A illustrates a plan view of the PCB 200 and FIG. 2B illustrates a side view of the PCB 200 at cross-section line 220. For ease of illustration, a single-sided PCB having a minimal number of layers is illustrated as PCB 200. Those skilled in the art may adapt the techniques disclosed herein for implementation in more complex PCB configurations without departing from the spirit or scope of the present invention.

In the illustrated embodiment, the PCB 200 includes a plane/metal layer 230 upon which a lower dielectric layer 234 is deposited. Deposited on the lower dielectric layer 234 is a signal layer comprising a stripline transmission line 206 (analogous to transmission line 106, FIG. 4) and a deposited resistor 212 (analogous to deposited resistor 112), whereby the deposited resistor 212 is electrically connected to the transmission line 206. The direction(s) of the propagation of a data signal transmitted via the transmission line 206 are illustrated by direction line 204. The transmission line 206 may be implemented as part of a single-ended signal application, a differential pairs signal application, or a multi-conductor signal application, as well as in other types of signal applications as appropriate.

Although the illustrated embodiment depicts the deposited resistor 212 as deposited perpendicular to the data signal propagation direction, the longitudinal axis of the deposited resistor 212 may be deposited relative to the signal propagation direction at any of a variety of angles. The resistive material of the deposited resistor 212 preferably is concentrated in a small area as possible to minimize its capacitive loading effect on the tapped transmission line 206.

While the resistor 212 is illustrated as being deposited in a substantially rectangular shape, the resistor 212 may be deposited in any of a variety of patterns, such as serpentine, squared, circular, trapezoidal, hollow rectangle/square or any other appropriate geometric shapes and combinations, without departing from the spirit or the scope of the present invention. The desired resistance of the deposited resistor 212 also may be achieved in any of a variety of ways. Resistive material could be deposited in a uniform manner, providing a uniform resistance across the resistor 212. Alternatively, the resistor 212 could be configured to be more resistive in proximity to the microvia 214 which may reduce the capacitive loading effect of the resistor 212 itself. This variance in resistance could be implemented using, for example, variable resistor doping. It may also be achieved by altering the geometry of the resistor 212, such as by using a series of stepped rectangles of resistive material with different length-to-width ratios or by using a tapered resistor. Further, a serpentine resistor could use the capacitance between successive arms to act as an equalization capacitance.

Deposited on the stripline transmission line 206 and the deposited resistor 212 is a top dielectric layer 232. Deposited on the top dielectric layer 232 is a surface layer 210 preferably including a ground plane comprising one or more conductive materials, such as copper, gold, aluminum, conductive polymers, alloys, etc.

The PCB 200, in one embodiment, further comprises a microvia 214 that preferably extends from the signal layer of the PCB 200 having the transmission line 206 and deposited resistor 212 through the top dielectric layer 232 to the surface layer 210. At the signal layer, in one embodiment, the microvia 214 is electrically connected to an edge of the deposited resistor 212 opposite of the transmission line 206. Although a microvia 214 or via preferably are used to provide a conduction path from the signal layer to the surface layer 210, other conduction means may be implemented as appropriate.

At the surface layer 210, the microvia 214 is electrically connected to a signal electrode 216 deposited at the surface layer 210. As with the ground plane, the signal electrode 216 may comprise any of a variety of conductive materials. Grounding pads 222, 224 and electrode pads 226 may be disposed on the grounding plane 210 and the signal electrode 216, respectively, in conformance with any of a variety of well-known probe contact patterns.

It will be appreciated that in most implementations the ground plane of the surface layer 210 will serve as electrical ground for the PCB 200 whereas the microvia 214 and signal electrode 216 carry a voltage potential by virtue of their electrical connection to the transmission line 206 via the deposited resistor 212. Accordingly, the ground plane of the surface layer 210 may be configured to prevent direct electrical connection between the microvia 214/signal electrode 216 and the ground plane, thereby preventing the data signal from being drawn to electrical ground.

The separation of the microvia 214/signal electrode 216 and the ground plane can be accomplished in any of a variety of ways. For one, conductive material of the ground plane can be removed (or prevented from being deposited) in the proximity of the microvia 214/signal electrode 216, causing an air gap between the microvia 214/signal electrode 216 and the conductive material of the ground plane. Additionally, this gap may be filled by a dielectric material, thereby further insulating the microvia 214/signal electrode 216 from the ground plane.

The conductive layers of PCB 200 may comprise any of a variety of conductive materials known to those skilled in the art, such as copper or metal filled conductive paste. The dielectric layers may comprise any of a variety of dielectric materials known to those skilled in the art, such as epoxy, Teflon, polypropylene, thermount, poyimide, etc. The deposited resistor 212 may comprise any of a variety of electrically resistive materials, such as carbon, nickel, ceramic metal composites, and the like.

As noted above, the use of the deposited resistor 212 acts to buffer effects the probe 120 (FIG. 1) and microvia 214 the integrity of the data signal transmitted over the transmission line 206. The buffer effect is actuated in part by the impedance inherent to the deposited resistor 212. The buffer effect also is a result of the distance (distance 236) the resistor 212 provides between the microvia 214 and the transmission line 210. Those skilled in the art will recognize that the capacitance between two conductors is an inverse function of the distance between the conductors (although not strictly linearly proportional). Accordingly, since the resistor 212 allows the microvia 214 to be situated at a greater distance from the transmission line 206 than would a direct tap or via in a conventional test point implementation, the capacitive effect of the microvia 214 is substantially reduced by comparison.

Figure 3:
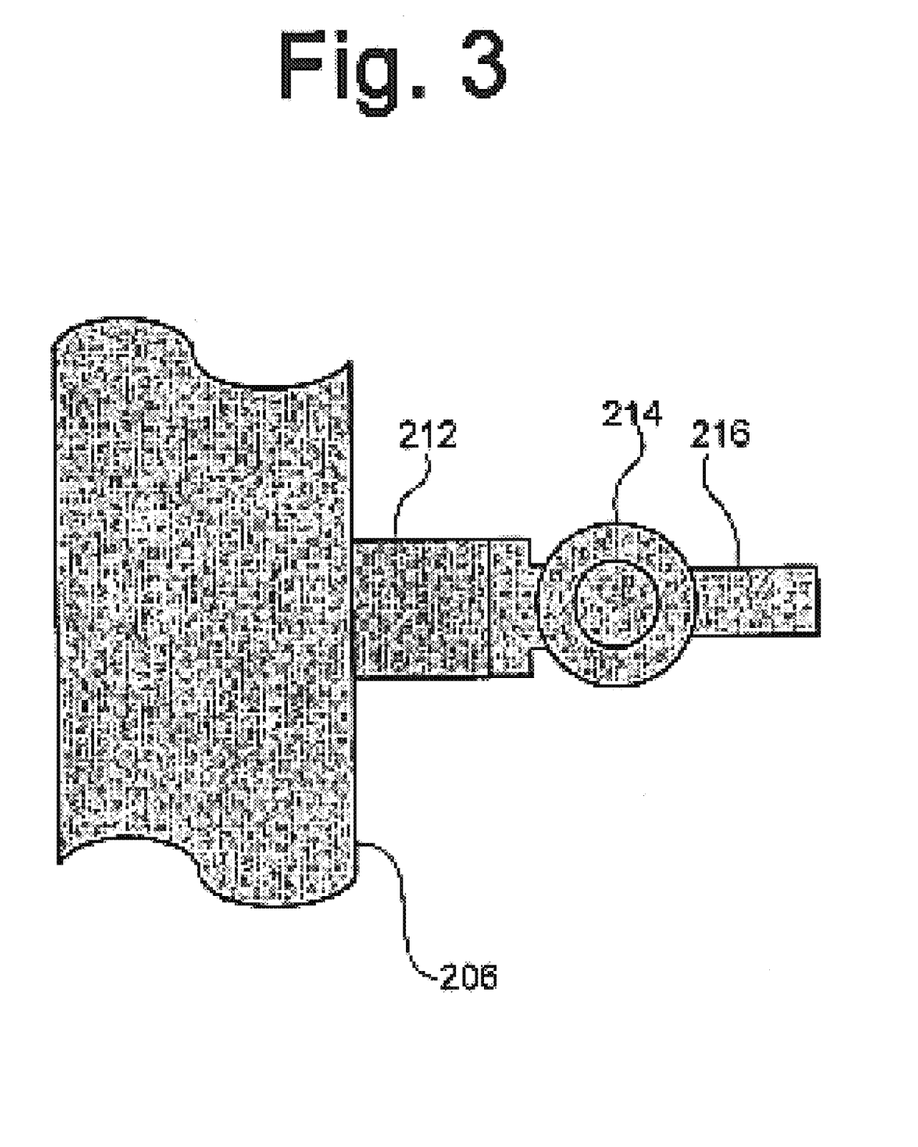
FIG. 3 is a plan view illustrating the exemplary PCB of FIG. 2 with a surface layer and top dielectric layer of the PCB removed in accordance with at least one embodiment of the present invention.

Referring now to FIG. 3, the exemplary test point of the PCB 200 comprising the deposited resistor 212 electrically connecting the microvia 214 and signal electrode 216 to the transmission line 206 is illustrated with certain layers of the PCB 200 removed. Using the guidelines provided herein, those skilled in the art may use the exemplary implementation illustrated in FIGS. 2 and 3 to provide a test point in PCB having an embedded microstrip strip line, whereby the deposited resistor 212 and the microvia 214 or other tap may be used to provide a test point for a probe that reduces or eliminates data signal disturbances.

Figure 4A:
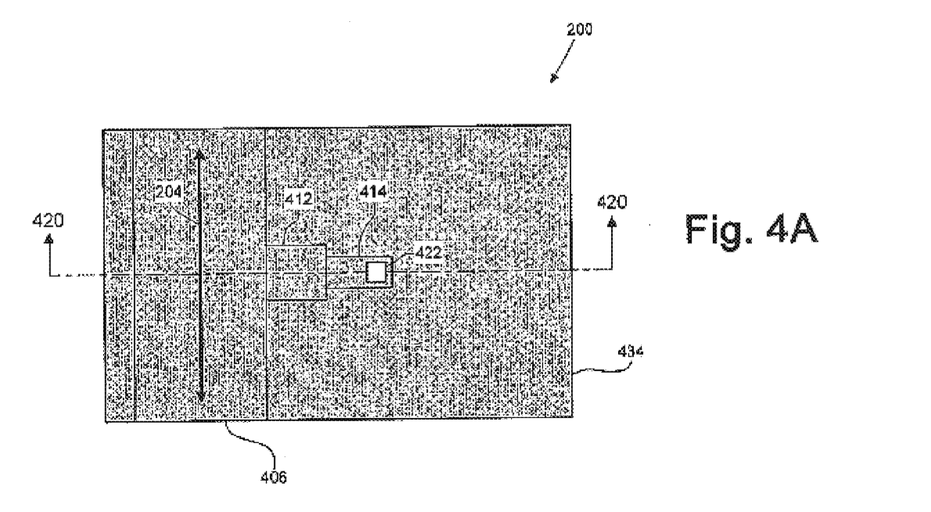
FIG. 4A is a plan view illustrating an exemplary printed circuit board (PCB) having a microstrip transmission line and a test point comprising a deposited voltage-divider resistor and signal electrode in accordance with at least one embodiment of the present invention.
Figure 4B:
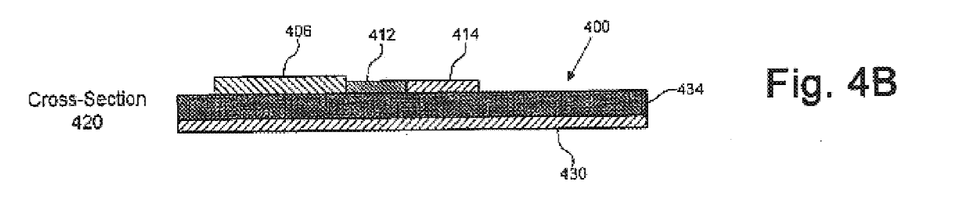
FIG. 4B is a side view illustrating a cross-section of the exemplary PCB of FIG. 4A in accordance with at least one embodiment of the present invention.

Referring now to FIGS. 4A and 4B, an exemplary PCB 400 implementing an exemplary test point for monitoring a data signal transmitted via a microstrip transmission line is illustrated in accordance with at least one embodiment of the present invention. FIG. 4A illustrates a plan view of the PCB 400 and FIG. 4B illustrates a side view of the PCB 400 via cross-section line 420. For ease of illustration, a PCB having a minimal number of layers is illustrated as PCB 400. Those skilled in the art may adapt the techniques disclosed herein for implementation in more complex PCB configurations without departing from the spirit or scope of the present invention.

It will be appreciated that taps may be unnecessary to gain electrical access from the surface layer to the transmission line in PCBs implementing microstrip transmission lines as microstrip transmission lines typically are deposited on the surface layer of the PCB. However, the introduction of a probe directly to the microstrip transmission line or the use of a SMT or other discrete resistor to monitor the data signal from a microstrip still may cause a number of the signal perturbations described above. Test points implemented in the exemplary PCB 400 in accordance with the present invention may reduce or eliminate these signal perturbations.

The exemplary PCB 400, as illustrated, includes a plane/metal layer 430 upon which a dielectric layer 434 is deposited. A microstrip transmission line 406 is deposited upon the dielectric layer 434. In at least one embodiment, resistive material may be deposited on the dielectric layer 434 to form a deposited resistor 412, whereby the deposited resistor 412 is in electrical contact at one end with the microstrip transmission line 406. The transmission line 406 may be implemented as part of a single-ended signal application, a differential pairs signal application, or a multi-conductor signal application, as well as in other types of signal applications as appropriate.

Further, in one embodiment, a signal electrode 414 is deposited at another end of the deposited resistor 412 such that the signal electrode 414 is in electrical contract with the deposited resistor 412 and is, therefore, in electrical contact with the microstrip transmission line 406. The signal electrode 414 may also include a probe pad 422 to facilitate connection to a probe or a probe connector, as described above.

Note that unlike deposited resistor 212 which is embedded in the PCB 200 (FIG. 2), the resistor 412 typically is deposited at the surface layer of the PCB 400 rather than embedded within the PCB 400 (unless it is coated with another layer of dielectric). However, resistor 212 may be said to be deposited at the signal layer of the PCB 200 while also being embedded in the PCB. Accordingly, any reference or description herein to a deposited resistor applies to an embedded resistor, and vice versa, unless otherwise noted.

As with the deposited resistor 212, the deposited resistor 412 may reduce or eliminate signal disturbances caused by the introduction of a probe (e.g., probe 120, FIG. 1). However, because the microstrip transmission line 406 is typically located at the surface layer of the PCB 400 (i.e., the surface layer includes the signal layer), a microvia or other via (e.g., microvia 214, FIG. 2) usually is not necessary. Accordingly, the negative signal effects of the test point exemplary illustrated in FIG. 4 may be further reduced.

Figure 5:
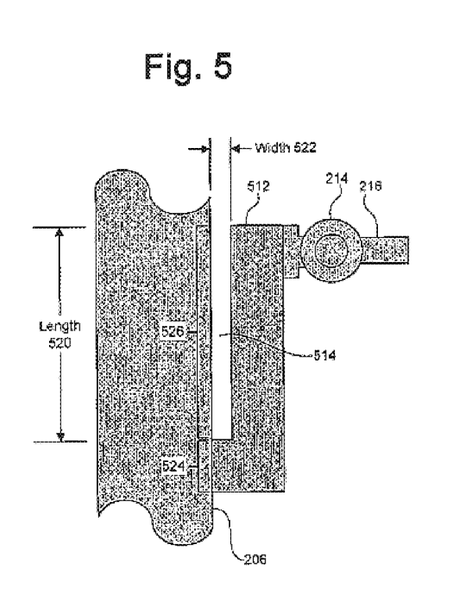
FIGS. 5 and 6 are plan views of a PCB illustrating exemplary test points having deposited resistors attached to a transmission line so as to provide a compensation capacitance in accordance with at least one embodiment of the present invention.
Figure 6:
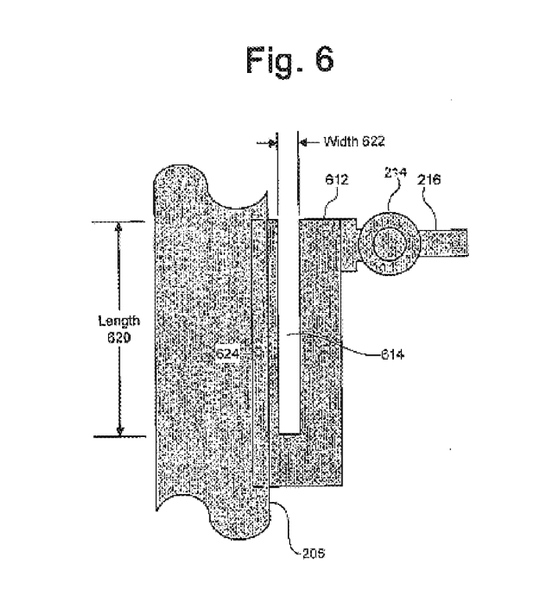

Referring now to FIGS. 5 and 6, various implementations of a test point having an equalization capacitance are illustrated in accordance with at least one embodiment of the present invention. While FIGS. 5 and 6 are discussed below in the context of the exemplary PCB 200 (FIG. 2) having a deposited resistor 212 and microvia 214 for providing test access to a stripline transmission line 206, the techniques described herein equally apply to the exemplary PCB 400 (FIG. 4) having the deposited resistor 412 for access to a microstrip transmission line 406.

As noted above, the deposited resistor 212 typically buffers any effect the microvia 214 and/or probe 120 (FIG. 1) would otherwise have on the data signal transmitted over the transmission line 206/406. The microvia 214, however, may introduce signal distortion and loss in the signal measured by the probe 120 (FIG. 1). Accordingly, in at least one embodiment, an equalization capacitance may be implemented across some or all of a deposited resistor to minimize any detrimental signal effects resulting from the microvia 214. The benefit of this equalization capacitance is discussed in greater detail below with reference to FIGS. 13–15.

The equalization capacitance may be implemented in a PCB having a test point in accordance with the present invention in any of a variety of ways, two of which are illustrated in FIGS. 5 and 6. FIG. 5 illustrates one implementation whereby the resistor 512 (analogous to resistor 212, FIG. 2) is embedded in a PCB such that the resistor 512 is in electrical contact with the transmission line 206 along region 524. The resistor 512 may then be further deposited in the PCB such that a portion of the deposited resistor 512 runs substantially parallel with the transmission line 206, but where the deposited resistor 512 is not in electrical contact with the transmission line 206 along region 526. In other words, a non-conductive gap 514 is created between the deposited resistor 512 and the transmission line 206 for a substantial portion of the resistor 212. In the illustrated embodiment, the gap 514 has a length 520 and a width 522.

Figure 13:
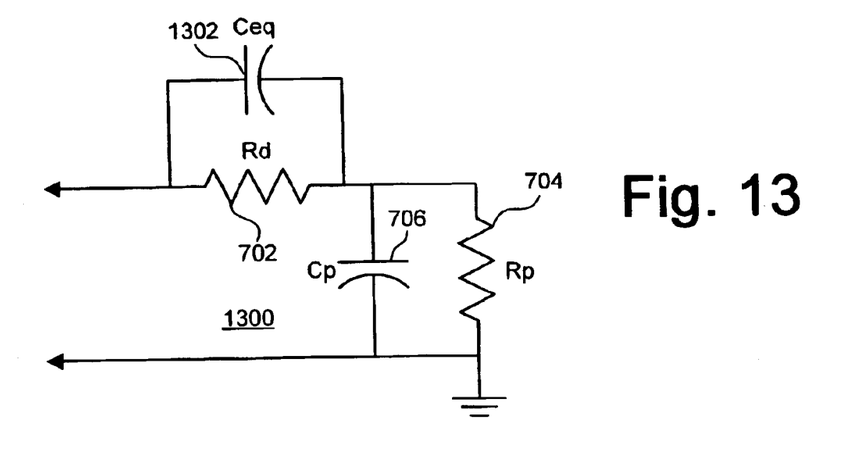
FIG. 13 is a circuit diagram illustrating an exemplary test point having a deposited resistor and compensation capacitor in accordance with at least one embodiment of the present invention.

Those of ordinary skill in the art will recognize that the gap 514 typically introduces a capacitive element to the signal transmitted through the resistor 512 to the microvia 214, where the capacitive element is in parallel with some or all of the impedance represented by resistor 512 (see FIG. 13). This equalization capacitance, in at least one embodiment, provides a high-frequency boost that compensates for the loss caused by the microvia 214.

In some instances, it may be advantageous to configure the gap 514 to provide a capacitance appropriate the particular features of the PCB in which a test point is implemented. For example, the gap 514 may be configured to provide a capacitance preferably between 1 fF and 1 pico-Farad (pF), more preferably between 1 fF and 500 fF, more preferably between 1 fF and 100 fF, and most preferably about 22.3 fF. To configure a desired capacitance resulting from the gap 514, the length 520 and/or width 522 may be adjusted. To illustrate, a width 522 of about 0.001 inch (0.0254 millimeters) typically provides a capacitance of about 1.5 fF per mil of gap length 520. In this case, to achieve a capacitance of 22.3 fF, the gap length 520 can be configured as about 15 mils.

The creation of the gap 514 in a PCB may be accomplished in any of a variety of ways. To illustrate, the deposited resistor 512 could be deposited in the PCB such that the gap 514 is a result of the deposition of the resistive material. Alternatively, the gap 514 can be created after deposition of the deposited resistor 512 by removing deposited resistive material to create the gap 514. The gap 514 may then be filled with a dielectric material as appropriate. For example, the gap 514 may be filled during a lamination process typically employed in multilayer PCB manufacture.

FIG. 6 illustrates another method of creating a capacitive element to compensate for signal loss/distortion resulting from the deposited resistor 612 (analogous to resistor 212/412). In the illustrated embodiment of FIG. 6, the gap 614 (analogous to gap 514, FIG. 5) is created as part of the resistor 612, where the resistor 612 is in electrical contact with the transmission line 206 along region 624. The gap 614 may be created as a result of the deposition of the resistive material or by removing the material from gap 614 using, for example, a laser trim cut or other material removal technique. As with the gap 514 of FIG. 5, the length 620 and/or the width 622 of the gap 614 may be adjusted to achieve the desired capacitance.

At this point, an exemplary method for utilizing the test point having a deposited resistor to monitor a data signal transmitted via a transmission line of a PCB will be described for explanatory purposes. In at least one embodiment, a method for monitoring the data signal may comprise transmitting an electrical signal representative of the data signal from the transmission line to a signal electrode through the deposited resistor 212/512/612 to generate an impeded signal (i.e., a signal having a lower voltage potential). This impeded signal, representing the data signal, may then be transmitted from the signal electrode to the signal monitor 124 (FIG. 1) via the probe 120 attached to the PCB using a probe connector. The probe connector can include, for example, the pads 222–226 (FIG. 2) or a coaxial cable connector electrically connected to the ground plane of the surface layer and the signal electrode 216 (FIG. 2). Additionally, a via or microvia 214 may be used to provide a conductive path from the signal layer to the surface layer when the transmission line is embedded in the PCB. Further, the transmission of the impeded signal through the deposited resistor 512/612 having a non-conductive gap 514/614 generally would generate an equalization capacitance dependent in part on the width and/or length of the gap 514/614.

Upon reaching the microvia 214, the impeded signal may then be transmitted to the signal monitor 124 via the probe 120 and probe cable 122. The impeded signal may then be monitored by the signal monitor 124 as appropriate.

Figure 7:
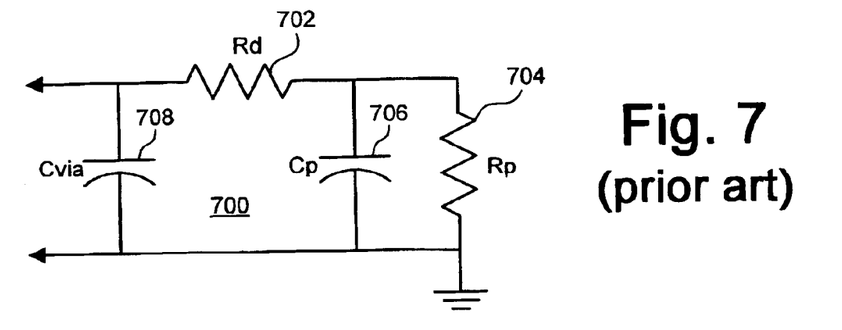
FIG. 7 is a circuit diagram illustrating a prior-art test point for measuring a transmission line signal in a PCB.
Figure 8:
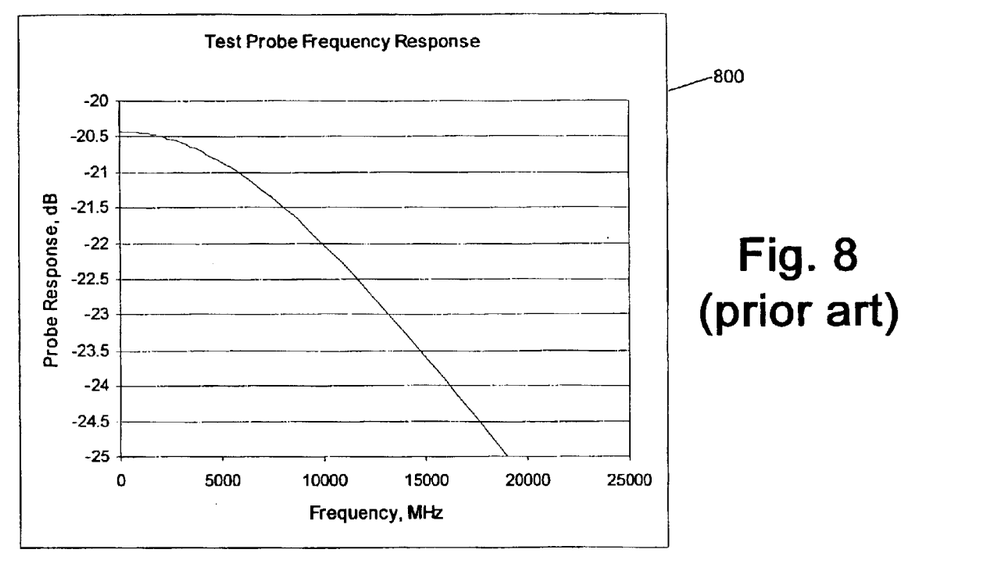
FIG. 8 is a chart illustrating an exemplary frequency response of the prior-art test point of FIG. 7.
Figure 9:
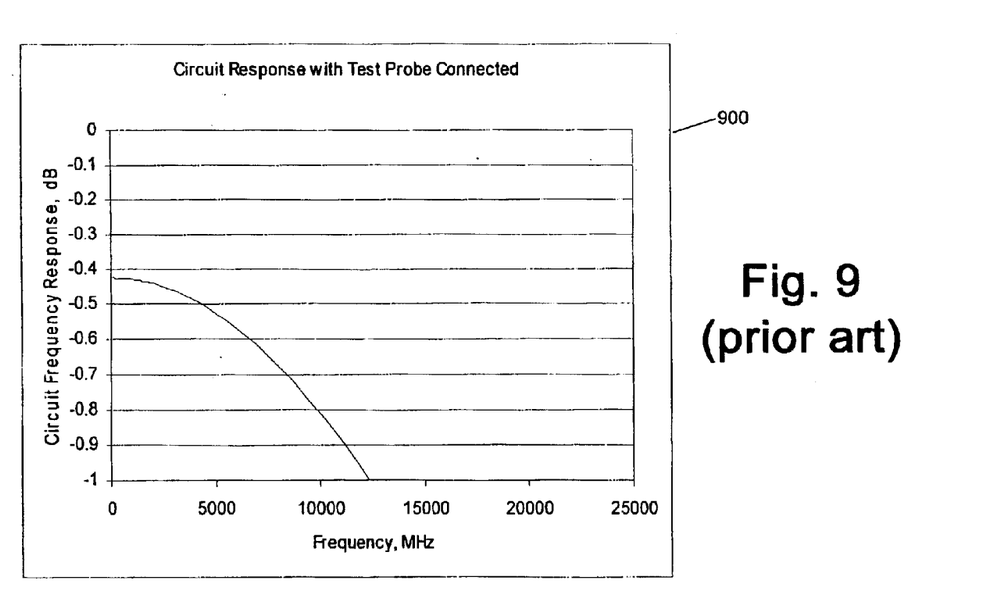
FIG. 9 is a chart illustrating an exemplary circuit response of the prior-art test point of FIG. 7.

Referring now to FIGS. 7–9, an exemplary circuit diagram and exemplary frequency responses of a typical prior-art test point in a PCB are illustrated. Circuit 700 of FIG. 7 represents the conventional test point, probe 120, transmission cable 122, and signal monitor 124 (FIG. 1) as seen from a transmission line in a PCB. Resistance Rp (resistor 704) represents the resistance of the probe 120/transmission cable 122/signal monitor 124. Resistance Rp typically is about 50Ω. Capacitance Cp (capacitor 706) represents the capacitance associated with PCB probe pads or probe connection socket used to connect the probe 120 to the PCB. Capacitance Cp typically is about 200 fF. Resistance Rd (resistor 702) represents the voltage-dividing resistance. With respect to prior-art techniques represented by FIG. 7, resistance Rd typically is implemented as a SMT resistor or other discrete resistor on the surface of the PCB. This resistance typically is about 450Ω or about 950Ω. Capacitance Cvia (capacitor 708) represents the capacitance resulting from prior-art techniques implementing a transmission line tap to access the transmission line from the surface of the PCB. Capacitance Cvia typically is about 200 fF.

Those of ordinary skill will recognize that the capacitance Cvia acts as a high-frequency shunt, drawing the signal transmitted over the transmission line to ground at higher frequencies. Further, the solder joints at each end of the SMT resistor (resistance Rp) as conventionally implemented would contribute additional capacitance to Cvia and Cp, thus providing additional attenuation in both the digital signal path as well as the monitored signal path. As a result, the implementation of a conventional test point typically significantly and detrimentally affects both the data signal and the measurement of the signal via the test point. For example, FIG. 8 includes a chart 800 illustrating an exemplary test probe frequency response using a conventional test point setup. As illustrated, the probe response (the ordinate axis of chart 800) exponentially drops to about −25 decibels (dB) at 2 gigaherz (GHz) (the abscissa axis of chart 800), representing a significant reduction the measured signal integrity as frequency increases. Similarly, FIG. 9 includes a chart 900 illustrating an exemplary circuit frequency response using a conventional test point setup. As illustrated, the circuit response (the ordinate axis of chart 900) exponentially drops to about −1 decibel (dB) at about 1.25 gigaherz (GHz) (the abscissa axis of chart 800), representing a significant reduction the signal integrity of the transmitted signal as frequency increases.

Figure 10:
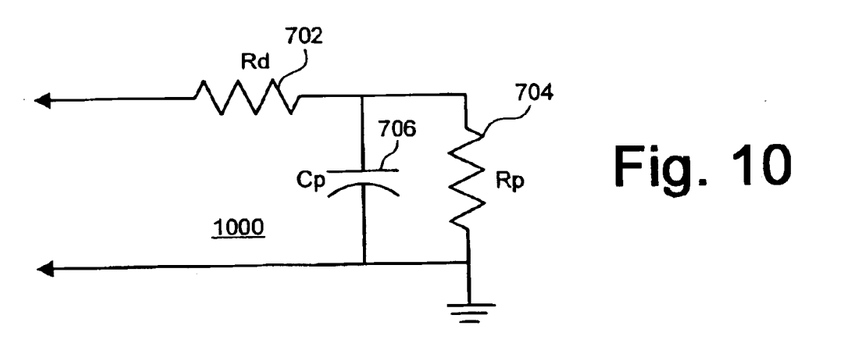
FIG. 10 is a circuit diagram illustrating an exemplary test point having a deposited resistor in accordance with at least one embodiment of the present invention.
Figure 11:
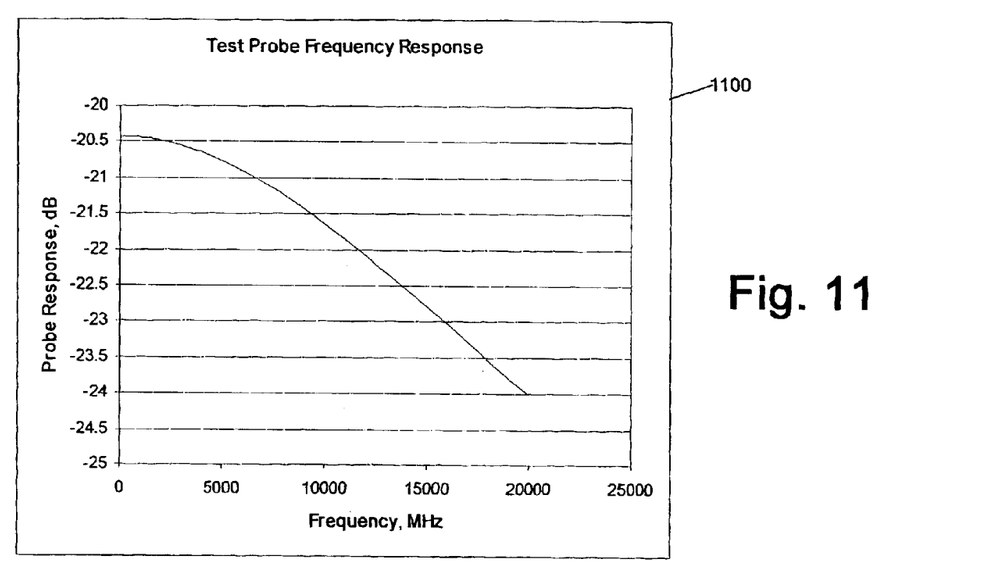
FIG. 11 is a chart illustrating an exemplary frequency response of the exemplary test point of FIG. 10 in accordance with at least one embodiment of the present invention.
Figure 12:
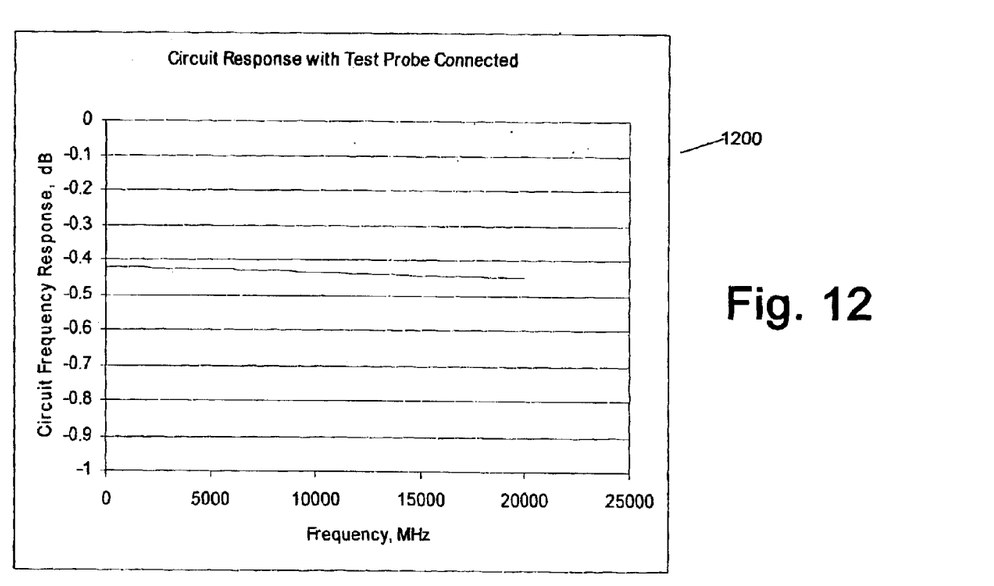
FIG. 12 is a chart illustrating an exemplary circuit response of the exemplary test point of FIG. 10 in accordance with at least one embodiment of the present invention.

Referring now to FIGS. 10–12, an exemplary circuit diagram of a test point having a deposited passive resistance in a PCB is illustrated in accordance with at least one embodiment of the present invention. Circuit 1000 of FIG. 10 represents a test point having a deposited resistor 212 and a microvia 214 or other via; the probe 120; transmission cable 122; and signal monitor 124 (FIG. 1) as seen from the transmission line 106 in the PCB 110 (FIG. 1).

The resistance Rp (resistor 704), capacitance Cp (capacitor 706) and voltage-divider resistance Rd (resistor 702) typically are present as in circuit 700. Note, however, that resistance Rd is a result of the deposited resistor 212, rather than a SMT or other discrete resistor typically used in conventional test points.

Unlike conventional test point implementations (represented by circuit 700, FIG. 7), in at least one embodiment, the use of the deposited resistor 212 having direct electrical contact with the transmission line 206 eliminates or significantly reduces the capacitance Cvia (capacitor 708, FIG. 7) resulting from the use of a via or microvia (e.g., microvia 214, FIG. 2). Accordingly, the overall frequency response of the test signal and the transmission signal are significantly improved over prior-art techniques. To illustrate, chart 1100 of FIG. 11 demonstrates that, in an exemplary implementation, the present invention results in reduction of the frequency response of the probe to only −24 dB at 2 GHz (compared to −25 dB at 2 GHz for circuit 700 in chart 700, FIG. 8). Even more telling is the frequency response of the circuit implemented in the PCB. As chart 1200 of FIG. 12 illustrates, the test point of the present invention typically results in a negligible reduction in the circuit response as frequency increases.

Figure 14:
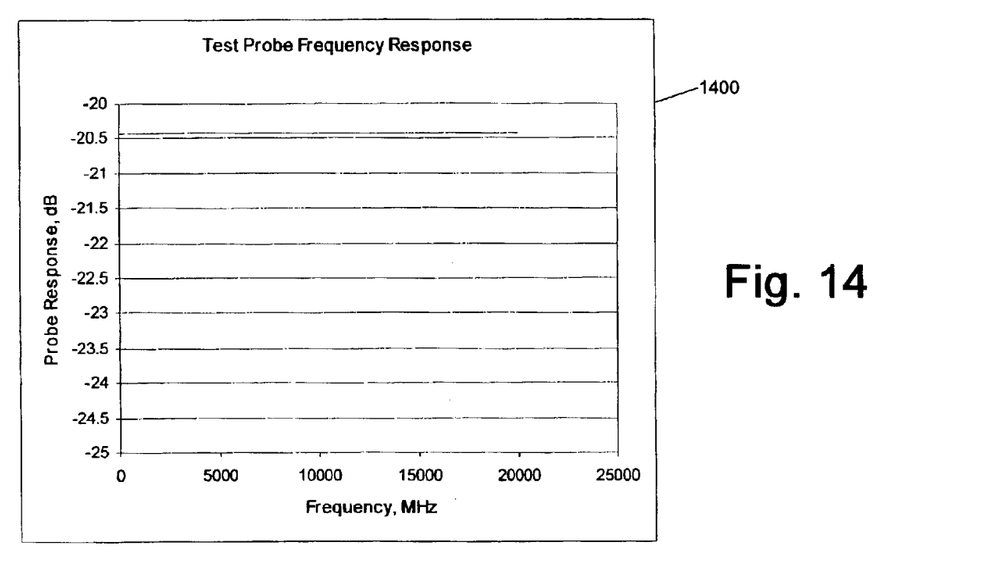
FIG. 14 is a chart illustrating an exemplary frequency response of the exemplary test point of FIG. 13 in accordance with at least one embodiment of the present invention.
Figure 15:
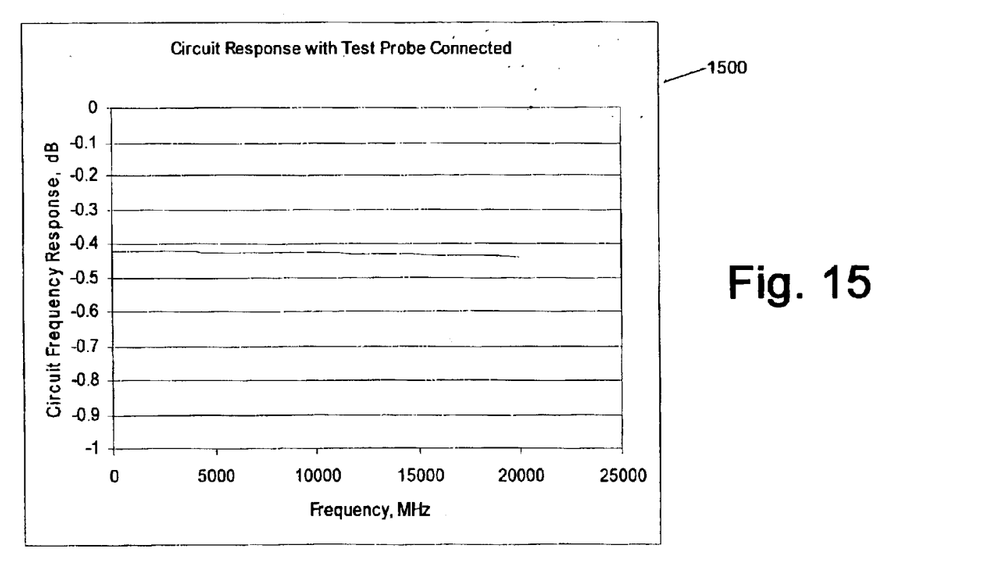
FIG. 15 is a chart illustrating an exemplary circuit response of the exemplary test point of FIG. 13 in accordance with at least one embodiment of the present invention.

Referring now to FIGS. 13–15, an exemplary circuit diagram of a test point having a deposited passive resistance and equalization capacitance in a PCB is illustrated in accordance with at least one embodiment of the present invention. Circuit 1300 represents a test point having a deposited resistor 212, equalization capacitance, and a microvia 214 or other via; the probe 120; transmission cable 122; and signal monitor 124 (FIG. 1) as seen from the transmission line 206 in a PCB.

As with circuit 1000 (FIG. 10), the circuit 1300 includes the resistance Rp (resistor 704) and capacitance Cp (capacitance 606) of the signal monitor/probe and the voltage-dividing resistance 602 resulting from the deposited resistor 512/612 (FIGS. 5, 6). In addition, like the circuit 1000, the circuit 1300 does not include the capacitance Cvia (capacitor 708, FIG. 7) to any significant extent by virtue of the resistor 512/612. Unlike circuit 1000, however, the circuit 1300 further includes equalization capacitance Ceq (capacitor 1302) that in parallel with some or all of the voltage-divider resistance Rd of the deposited resistor 512/612. As noted above in FIGS. 5 and 6, this equalization capacitance can be implemented by introducing a non-conductive gap between the transmission line 206 and a portion of the resistor 512/612.

As circuit 1300 demonstrates, the equalization capacitance Ceq operates to minimize or eliminate the capacitance Cvia resulting from the microvia 214 while preventing increase in the capacitance Cp. As a result, the probe frequency response is flattened significantly, as illustrated with reference to chart 1400 of FIG. 14 (compare to charts 800 and 1100, FIGS. 8 and 11 respectively). Likewise, the circuit frequency response also is significantly flattened, as illustrated with reference to chart 1500 of FIG. 15 (compare to charts 900 and 1100, FIGS. 9 and 11 respectively).

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A printed circuit board (PCB) comprising:
   a transmission line deposited at a signal layer of the PCB for transmitting a data signal;
   a signal electrode for providing an electrical connection between the PCB and a probe of a signal monitor; and
   a resistor deposited at the signal layer and being in electrical communication with the transmission line and the signal electrode, wherein the resistor is adapted to transmit an impeded signal from the transmission line to the signal electrode, the impeded signal being representative of the data signal.

2. The PCB of claim 1, wherein the transmission line includes a stripline transmission line.

3. The PCB of claim 2, wherein the PCB further comprises:
   a microvia in electrical communication with the deposited resistor at the signal layer and the signal electrode and being adapted to transmit the impeded signal from the deposited resistor to the signal electrode.

4. The PCB of claim 3, further comprising a non-conductive gap between a substantial portion of the resistor and the transmission line, the gap providing an equalization capacitance between the transmission line and the microvia.

5. The test point of claim 4, wherein the equalization capacitance is between about 1 femptoFarad and about 1 picoFarad.

6. The test point of claim 4, wherein the equalization capacitance is about 22.3 femptoFarad.

7. The PCB of claim 1, wherein the transmission line includes a microstrip transmission line and where the signal layer is part of a surface layer of the PCB.

8. The PCB of claim 7, further comprising a non-conductive gap between a substantial portion of the resistor and the microstrip transmission line, the gap providing an equalization capacitance between the transmission line and the microvia.

9. The PCB of claim 1, wherein the transmission line includes an embedded microstrip transmission line.

10. The PCB of claim 9, wherein the PCB further comprises:
   a microvia in electrical communication with the deposited resistor at the signal layer and the signal electrode and being adapted to transmit the impeded signal from the deposited resistor to the signal electrode.

11. The PCB of claim 1, further comprising a probe connector electrically connected to the signal electrode and being adapted to facilitate a connection of the probe to the signal electrode.

12. The PCB of claim 1, wherein the deposited resistor has a resistance of about 450 Ω.

13. The PCB of claim 1, wherein the deposited resistor has a resistance of about 950 Ω.

14. A method for monitoring a data signal transmitted over a transmission line at a signal layer of a printed circuit board (PCB), the method comprising the steps of:
   transmitting an electrical signal representative of the data signal from the transmission line to a signal electrode through a resistor deposited at the signal layer to generate an impeded signal; and
   transmitting the impeded signal from the signal electrode to a signal monitor via a probe attached to the signal electrode.

15. The method of claim 14, wherein the deposited resistor includes a non-conductive gap between a substantial portion of the deposited resistor and the transmission line and where the transmission of the electrical signal through the deposited resistor generates an equalization capacitance between the transmission line and the signal electrode.

16. The method of claim 15, wherein the equalization capacitance is about 22.3 femptoFarads.

17. The method of claim 14, wherein the transmission line includes a microstrip transmission line deposited at a surface layer of the PCB, the surface layer including the signal layer.

18. The method of claim 14, wherein the transmission line includes one of a group consisting of: an embedded microstrip transmission line and a stripline transmission line.

19. The method of claim 18, wherein the step of transmitting the electrical signal includes transmitting the electrical signal from the deposited resistor to the signal electrode via a microvia extending from the signal layer to the signal electrode.

20. The method of claim 14, wherein the deposited resistor is about 450 Ω.

* * * * *